(12) United States Patent
Kim et al.

(10) Patent No.: US 6,344,380 B1
(45) Date of Patent: Feb. 5, 2002

(54) MANUFACTURING OF GATE ELECTRODES HAVING SILICON OF DIFFERENT GRAIN SIZES AND DIFFERENT SURFACE ROUGHNESS

(75) Inventors: Hyeon-cheol Kim; Heon-jong Shin, both of Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/296,218

(22) Filed: Apr. 22, 1999

(30) Foreign Application Priority Data

Jul. 22, 1998 (KR) .............................. 98-29526

(51) Int. Cl.⁷ .................. H01L 21/336; H01L 21/4763
(52) U.S. Cl. .................. 438/197; 438/198; 438/199; 438/592
(58) Field of Search ................... 438/198, 197, 438/199, 592, 301, 586; 257/64, 557, 661, 74, 75; 148/1.15, 175, 187; 29/571, 591; 357/59

(56) References Cited

U.S. PATENT DOCUMENTS

| 4,479,831 A | | 10/1984 | Sandow et al. ............... 148/1.5 |
| 4,992,846 A | * | 2/1991 | SakaKibara et al. .......... 357/59 |
| 5,457,058 A | * | 10/1995 | Yonehara ..................... 437/24 |
| 5,767,004 A | * | 6/1998 | Balasubramanian et al. ..... 438/592 |
| 5,936,262 A | * | 8/1999 | Batra et al. .................... 257/66 |
| 6,017,782 A | * | 1/2000 | Batra et al. .................. 438/158 |

FOREIGN PATENT DOCUMENTS

| JP | 2224223 | 9/1990 | ......... H01L/21/265 |
| JP | 3055850 | 3/1991 | ......... H01L/21/336 |

* cited by examiner

Primary Examiner—Olik Chaudhuri
Assistant Examiner—Shrinivas H. Rao
(74) Attorney, Agent, or Firm—Mills & Onello LLP

(57) ABSTRACT

A gate electrode structure of a semiconductor device and a manufacturing method thereof are provided. The gate electrode structure includes a first silicon layer pattern formed of a polycrystalline silicon layer and a second silicon layer pattern having surface roughness lower than that of the first silicon layer pattern formed on the first silicon layer pattern.

6 Claims, 2 Drawing Sheets

MANUFACTURING OF GATE ELECTRODES HAVING SILICON OF DIFFERENT GRAIN SIZES AND DIFFERENT SURFACE ROUGHNESS

BACKGROUND OF THE INVENTION

1. Field of the Invention

The present invention relates to a semiconductor device, and more particularly, to a gate electrode structure using a conductive silicon layer and a manufacturing method thereof.

2. Description of the Related Art

As semiconductor devices require higher integration and higher performance, the size constraints of conductive layer patterns such as gate electrodes become more strict, i.e., they require conductors of smaller size. For instance, gate electrodes having sizes of 0.25 μm or 0.18 μm or less are required. Also, where the gate electrode is formed under very small size constraints, maintenance of the gate electrode uniformity and low critical dimension variations on a chip are required.

FIG. 1 is a schematic diagram illustrating a conventional gate electrode structure. Referring to FIG. 1, a gate electrode 30 is formed over a gate oxide layer 200 which is formed on a semiconductor substrate 100. The gate electrode 30 is formed by patterning a polycrystalline silicon layer having conductivity obtained by doped impurities. The polycrystalline silicon layer is deposited at approximately 625° C. The polycrystalline silicon layer mostly consists of crystal grains.

Due to the crystal grains, a surface morphology of the polycrystalline silicon layer has fine flections as shown in FIG. 1. For instance, an interface region between two crystal grains has a surface height lower than the surface of the crystal grain. This is caused by a difference between the interface energy and the surface energy or a difference in the tension stresses. Thus, surface roughness of the polycrystalline silicon layer is increased.

Accordingly, when a photoresist layer is formed on the polycrystalline silicon layer for a gate electrode, and then exposure is performed, the incident light exposing the photoresist layer may be diffusely reflected. As a result, a photoresist pattern having irregular critical dimensions can be formed on the polycrystalline silicon layer.

When the polycrystalline silicon layer is patterned using the photoresist pattern with the irregular critical dimensions as an etch mask, a polycrystalline silicon layer pattern having the irregular critical dimension may be formed. That is, a polycrystalline silicon layer pattern 30 having a dimension 35 wider or narrower than the designed critical dimension 31 is formed. Also, a sidewall profile of the formed polycrystalline silicon layer pattern 30 is not uniform.

When the critical dimension of the polycrystalline silicon layer pattern 30 used for the gate electrode is changed, a process margin of the subsequent step is reduced, or the operation of a transistor may be degraded. More specifically, as the critical dimension of the gate electrode is changed, gate resistance is changed, and thus the operation current of the transistor is changed, which may cause failure in the operation of the transistor or reduction in the operational speed.

SUMMARY OF THE INVENTION

It is a first objective of the present invention to provide a gate electrode structure of a semiconductor device having a uniform critical dimension by improving a surface morphology.

It is another objective of the present invention to provide a method for manufacturing a gate electrode structure of a semiconductor device in which a surface morphology is improved to suppress a change of a critical dimension of the gate electrode.

Accordingly, to achieve the first objective, according to an aspect of the present invention, a gate electrode structure of a semiconductor device is provided. The structure includes a gate oxide layer formed on a semiconductor substrate and a first silicon layer pattern of polycrystalline silicon formed on the gate oxide layer. A second silicon layer pattern having surface roughness lower than that of the first silicon layer pattern is formed on the first silicon layer pattern. In one embodiment, the second silicon layer pattern includes crystal grains smaller than those of the first silicon layer pattern. Specifically, in one embodiment, the first silicon layer pattern has the crystal grains having sizes of approximately 100~300 Å. In one embodiment, the second silicon layer pattern is an amorphous silicon layer having crystal grains smaller than those of the first silicon layer pattern. The amorphous silicon layer pattern can have crystal grains with a size of approximately 40 Å or less.

The first silicon layer pattern can be a polycrystalline silicon layer pattern formed at approximately 580~650° C., and the second silicon layer pattern can be an amorphous silicon layer pattern formed at approximately 560~580° C. In another embodiment, the first silicon layer pattern is a polycrystalline silicon layer pattern formed at approximately 600~650° C., and the second silicon layer pattern is a silicon layer pattern formed at approximately 580~600° C.

To achieve the second objective, according to an aspect of the present invention, a gate oxide layer is formed on a semiconductor substrate. The step of forming the first silicon layer comprises the step of depositing silicon at approximately 580~650° C. to thereby form the first silicon layer.

A second silicon layer having the low surface roughness is formed on the first silicon layer. The step of forming the second silicon layer comprises the step of forming an amorphous silicon layer on the first silicon layer, and the step of forming the amorphous silicon layer comprises the step of depositing silicon at approximately 560~580° C. Preferably, silicon is deposited at approximately 560~570° C.

The step of forming the first silicon layer and the step of forming the second silicon layer can be performed by in-situ lowering the deposition temperature.

In one embodiment, the step of forming the first silicon layer comprises the step of depositing silicon at approximately 600~650° C. to thereby form a silicon layer of polycrystalline forming the second silicon layer can include depositing silicon at approximately 580~600° C. or less to thereby form a silicon layer having the surface roughness lower than that of the first silicon layer.

The second silicon layer and the first silicon layer are patterned to form a gate electrode.

According to the present invention, the gate electrode structure having a uniform critical dimension can be realized due to the good surface morphology of a conductive layer for the gate electrode. Thus, characteristics of a transistor can be stabilized.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
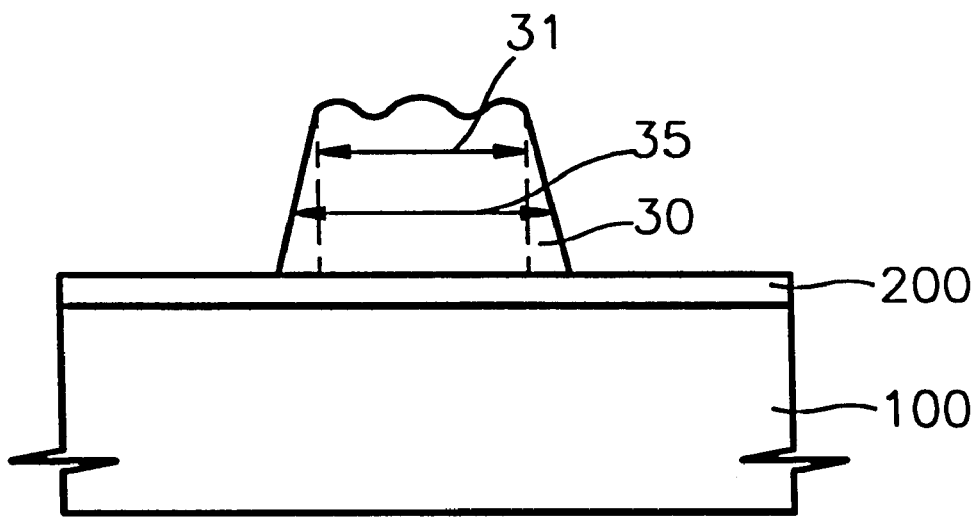
FIG. 1 is a schematic sectional view illustrating a conventional gate electrode structure.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 2:
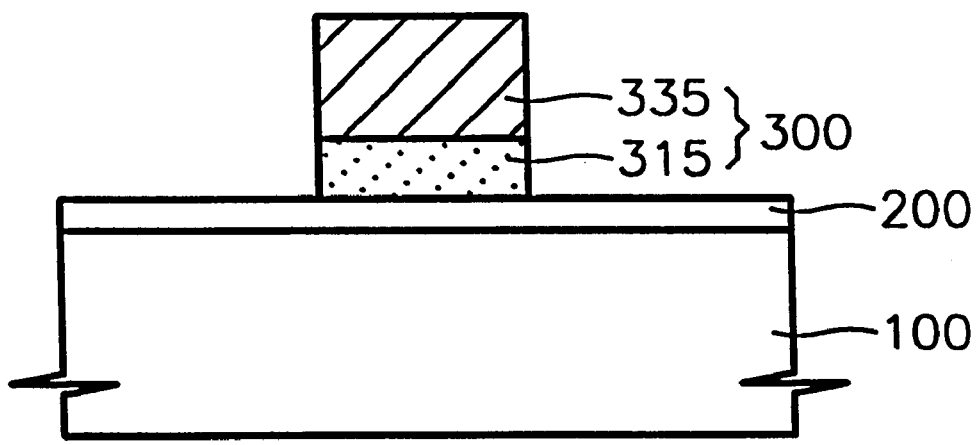
FIG. 2 is a schematic sectional view illustrating a gate electrode structure according to one embodiment of the present invention.

A gate electrode structure 300 according to an embodiment of the present invention will be described with reference to FIG. 2. In detail, the gate electrode structure 300 according to an embodiment of the present invention has a first silicon layer pattern 315 of polycrystalline and a second silicon layer pattern 335 having a surface roughness lower than that of the first silicon layer pattern 315, and formed on the first silicon layer pattern 315. The first silicon layer pattern 315 is formed on a semiconductor substrate, where a gate oxide layer 200 is interposed between the first silicon layer pattern 315 and the semiconductor substrate 100.

The first and the second silicon layer patterns 315 and 335 have conductivity obtained by being doped with an impurity. Since the first silicon layer pattern 315 is formed of a polycrystalline silicon layer, the surface roughness of the first silicon layer pattern 315 is relatively high. The surface roughness is usually influenced by the size of crystal grains forming the polycrystalline silicon layer. That is, as the size of the crystal grain becomes greater, the surface roughness is also increased, and thus the surface morphology is deteriorated.

In general, the polycrystalline silicon layer is formed of completely crystal grains or complex phase consisting of major phase with crystal grains and matrix phase with amorphous.

When the polycrystalline silicon layer is formed of completely crystal grains, a surface height difference between an interface portion between crystal grains. This is caused by a difference between the interface energy and surface energy of the crystal grains or a difference of tension stresses. When the polycrystalline silicon layer consists of major phase with crystal grains and matrix phase with amorphous, a difference in the surface height difference is generated between the crystal grain portion and the amorphous phase portion. A surface of the polycrystalline silicon layer has fine flections due to the difference in the surface height. Thus, the surface roughness is relatively increased to deteriorate the surface morphology.

In the gate electrode structure 300 according to an embodiment of the present invention, the second silicon layer pattern 335 having a surface roughness lower than that of the polycrystalline silicon layer covers the surface of the first silicon layer pattern 315 of the polycrystalline silicon layer to prevent the critical dimension of the gate electrode structure 300 from being changed due to a bad surface morphology of the polycrystalline silicon layer.

Thus, preferably, the size of the crystal grain in the second silicon layer pattern 335 is smaller than that of the first silicon layer pattern 315 of a polycrystalline silicon layer. For instance, when the first silicon layer pattern 315 has the crystal grain size of 100~300 Å, it is preferable that the second silicon layer pattern 335 has the crystal grain size of approximately 100 Å or less. More preferably, the second silicon layer pattern 335 has the crystal grain size of approximately 40 Å or less. That is, the second silicon layer pattern 335 mostly consists of an amorphous silicon layer.

Preferably, the first silicon layer pattern 315 consists of a polycrystalline silicon layer formed at approximately 580~65° C., and the second silicon layer 335 consists of an amorphous silicon layer formed at 580° C. or less, e.g., approximately 560~570° C.

When the first silicon layer pattern 315 consists of a polycrystalline silicon layer formed at approximately 600~650° C., the second silicon layer pattern 335 can consist of a polycrystalline silicon layer formed at approximately 580~600° C. The polycrystalline silicon layer formed at approximately 580~600° C. has crystal grain size much smaller than that of the polycrystalline silicon layer formed at approximately 600~650° C. Thus, in the above-described case, the objective of the present invention can be realized.

The size of the crystal grain of the silicon layer is usually related to the deposition temperature. That is, when a silicon source, e.g., a silane ($SiH_4$) gas, is deposited under condition of low pressure, e.g., approximately 120 mTorr, the deposition rate and the size of the crystal grain depends on the process temperature.

A growth rate of the crystal grain is thermodynamically high at a high temperature so that crystal grains of a large size are formed. Thus, the growth rate of the polycrystalline silicon layer, i.e., the deposition rate, also becomes high. However, the growth of the crystal grains is suppressed at a low temperature so that the amorphous phase becomes dominant. Also, the growth rate of the layer is reduced.

A relationship between the crystal grain size or the deposition rate, and the deposition temperature is schematically shown in Table 1. Table 1 shows the result of supplying the $SiH_4$ gas at the flow rate of 50 $cm^3$ per minute under pressure of approximately 120 mTorr to thereby form a silicon layer. The temperature range is set by a minimum temperature capable of depositing a silicon layer, i.e., at approximately 560~640° C.

Referring to Table 1, the crystal grain growth is substantially dominant at 580° C. or higher. Also, it is shown in Table 1 that the deposition rate and the surface roughness are relatively high above 620° C.

However, it is shown in Table 1 that the surface roughness is low at approximately 600° C. or less. Particularly, the crystal grain size of approximately 100 Å is shown and the surface roughness is rapidly reduced at the deposition temperature of approximately 580° C. or less.

TABLE 1

Characteristics of a Silicon Layer according to the Deposition Temperature

| Deposition temperature (° C.) | Crystallographic direction of crystal grain | Mean surface roughness (Å) | Mean size of crystal grain (Å) | Mean Deposition rate (Å/min) |
|---|---|---|---|---|
| 560 | amorphous phase | <15 | | 23 |
| 570 | amorphous phase | <5 | <40 | 27 |
| 580 | <311> | <15 | 100 | 33 |
| 600 | <311> | 20 | | 52 |
| 620 | <311> | 52 | 250 | 100 |
| 640 | <311> | 60 | | 180 |

That is, as shown in Table 1, a silicon layer formed by depositing at approximately 580~650° C., preferably at approximately 620~640° C., mostly consists of polycrystalline phase with crystal grains of the size of approximately 100 Å. The crystal grain of the silicon layer formed at approximately 640° C. is excessively grown to 300 Å or more. When the first silicon layer pattern 315 is formed of the silicon layer, the surface roughness of the first silicon layer pattern 315 can be 15 Å or more, i.e., the height difference between a highest surface region and a lowest surface region may be approximately 15 Å or more, e.g., 52 Å or more.

However, even if crystal grains grow in a silicon layer formed at approximately 580° C. or less, preferably approximately 560~570° C., the crystal grains have a mean size of approximately 40 Å or less, so that a silicon layer of an amorphous phase is substantially formed. Accordingly, when the second silicon layer pattern 335 consists of the silicon layer formed at the above temperature, the surface roughness can be maintained to approximately 15 Å or less. Thus, the relatively high surface roughness of the first silicon layer pattern 315 is compensated by the second silicon layer pattern 335.

Also, when the first silicon layer pattern 315 consists of a polycrystalline silicon layer formed at 600~650° C., and the second silicon layer pattern 335 is formed at approximately 580~600° C., the second silicon layer pattern 335 can relax the surface roughness of the first silicon layer pattern 315. This is supported by the fact that the surface roughness of the first silicon layer pattern 315 at 600~650° C. is approximately 20 Å, and the surface roughness of the second silicon layer pattern 335 at approximately 580~600° C. is approximately 20 Å or less.

A method for manufacturing a gate electrode structure according to an embodiment of the present invention will be described with reference to FIGS. 3 through 5.

Figure 3:
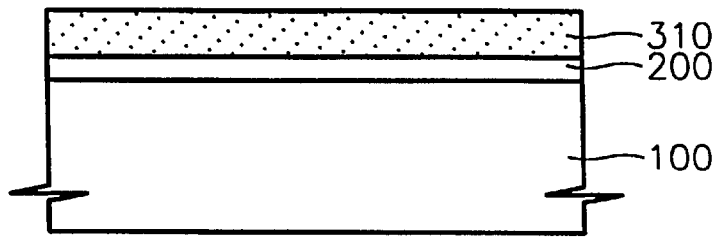
FIGS. 3 through 5 are schematic sectional views illustrating a method for manufacturing a gate electrode structure according to an embodiment of the present invention.

Referring to FIG. 3, a gate oxide layer 200 is formed on a semiconductor substrate 100. Then, a polycrystalline silicon layer 310 doped with impurities is deposited at approximately 580~650° C. For instance, silicon supplied from a silicon source gas such as a silane ($SiH_4$) gas is deposited on the gate oxide layer 200 to thereby form a polycrystalline silicon layer. Preferably, the polycrystalline silicon layer is deposited at approximately 620~640° C. Thus, a high growth rate of the polycrystalline silicon layer is realized, so that the process time is reduced to thereby increase productivity of fabricating the semiconductor device.

The first silicon layer 310 is formed at a high deposition temperature so that it mostly consists of polycrystalline crystal grains. Also, the crystal grain has a size greater than 100 Å, e.g., approximately 100~300 Å. Thus, a surface morphology of the first silicon layer 310 is deteriorated. This is because when the crystal grain size is increased, the surface roughness is increased to deteriorate the surface morphology.

Figure 4:
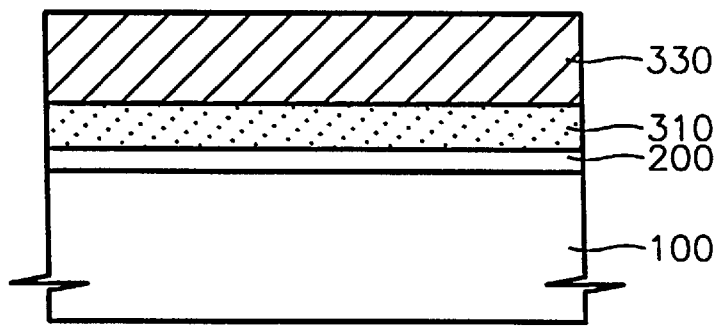

Referring to FIG. 4, a second silicon layer 330 formed of an amorphous silicon layer is formed on the first silicon layer 310 of polycrystalline. Here, the amorphous silicon layer is formed by depositing silicon at approximately 580° C. or less, preferably at approximately 560~570° C. For instance, the second silicon layer 330 is formed after depositing the first silicon layer 310 by in-situ ramping down the deposition temperature.

The formed amorphous silicon layer has crystal grains with the size of approximately 40 Å or less, or no crystal grain. Thus, the surface roughness is low. That is, the surface morphology is superior, so that the relatively high surface roughness of the first silicon layer 310 can be compensated.

In an alternative embodiment, when the first silicon layer 310 is formed at approximately 600° C., the second silicon layer 330 may be deposited at approximately 580~600° C. The formed second silicon layer 330 has characteristics of a polycrystalline silicon layer. However, the second silicon layer 330 has a very low crystal grain size and low surface roughness. Thus, good surface morphology can be realized so that the relatively high surface roughness of the first silicon layer 310 can be compensated.

Figure 5:
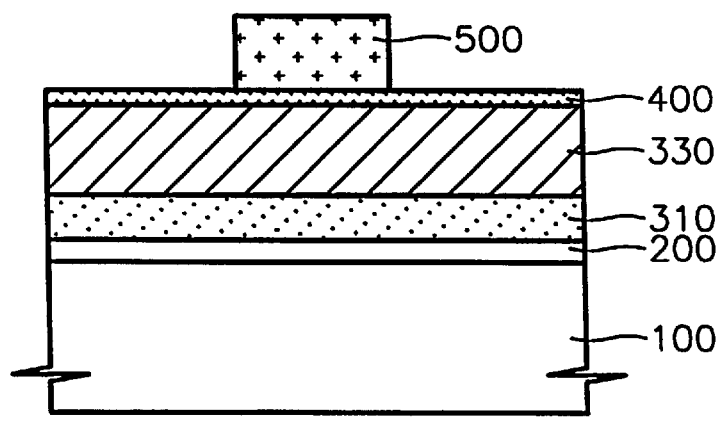

Referring to FIG. 5, a photoresist layer is formed on the second silicon layer 330 by a coating method. Then, the photoresist layer is exposed and developed to thereby form a photoresist pattern 500 partially exposing the second silicon layer 330.

As described above, in order to further suppress diffused reflection from the surface of an underlying layer, i.e., a second silicon layer 400, when the photoresist layer is selectively exposed, an anti-reflective layer 400 can be interposed on the second silicon layer 330. Thus, high resolution can be realized so that a photoresist pattern 500 having uniform critical dimension can be realized.

Further, the first silicon layer 310 which may cause diffused reflection due to high surface roughness is covered with the second silicon layer 330 having good surface morphology, so that the diffused reflection from the surfaces of the underlying layers of the photoresist layer, i.e., the first and the second silicon layers 310 and 330, during the exposure process can be maximally suppressed.

Then, the exposed second silicon layer 330 and the first silicon layer 310 are selectively etched using the photoresist pattern 500 as an etch mask. Thus, a gate electrode 300 comprised of the first silicon layer pattern 315 and the second silicon layer pattern 335 as shown in FIG. 2 is formed. Then, impurities are doped into the gate electrode 300 by ion implantation, so that the first silicon layer pattern 315 and the second silicon layer pattern 335 are conductive.

The above-described gate electrode 300 has very high critical dimension or good sidewall profile. This can be obtained from the uniform critical dimension of the photoresist pattern. Thus, the structure of the transistor having uniform dynamic characteristics can be realized to thereby realize an ultra-high integrated device of high performance.

Meanwhile, the amorphous silicon layer constituting the second silicon layer pattern 335 can recrystallize during the subsequent annealing process. Thus, the amorphous silicon layer is changed to a polycrystalline silicon layer.

If the amorphous silicon layer is formed directly on the gate oxide layer 200, stress may be generated by the recrystallization of the amorphous silicon layer. Due to the stress, quality of the gate oxide layer 200 may be deteriorated.

However, according to the embodiment of the present invention, the first silicon layer pattern 310 formed of a polycrystalline silicon layer is introduced a lower portion of the second silicon layer pattern 330, so that generation of the stress is suppressed. Thus, the gate oxide layer 200 is prevented from being deteriorated due to the stress.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A method for manufacturing a gate electrode structure of a semiconductor device comprising the steps of:

forming a gate oxide layer over a semiconductor substrate;

forming a first silicon layer of polycrystalline on the gate oxide layer, said forming a first silicon layer comprising depositing silicon at approximately 600~650° C. to thereby form a silicon layer of polycrystalline;

after forming the first silicon layer, forming a second silicon layer over the first silicon layer, the second silicon layer having a surface roughness lower than a surface roughness of the first silicon layer, said forming a second silicon layer comprising depositing silicon at approximately 580~600° C. or less to thereby form a silicon layer having a surface roughness lower than that of the first silicon layer, the second silicon layer having a crystal grain size less than 100 Å; and patterning the second silicon layer aid the first silicon layer to form a gate electrode;

wherein at least one of the first and second silicon layers is formed by flowing silane gas at a rate of 50 cm$^3$ per minute under pressure of approximately 120 mTorr.

2. The method of claim 1, wherein the step of forming the first silicon layer comprises the step of depositing silicon at approximately 580~650° C.

3. The method of claim 1, wherein the step of forming the second silicon layer comprises the step of forming an amorphous silicon layer over the first silicon layer.

4. The method of claim 3, wherein the step of forming the amorphous silicon layer comprises the step of depositing silicon at approximately 560~580° C.

5. The method of claim 4, wherein the step of forming the second silicon layer comprises lowering the deposition temperature used to form the first silicon layer.

6. The method of claim, 1, wherein the step of forming the first silicon layer comprises the step of depositing silicon at approximately 600~650° C. to thereby form a silicon layer of polycrystalline, and wherein the step of forming the second silicon layer comprises the step of depositing silicon at approximately 580~600° C. or less to thereby form a silicon layer having the surface roughness lower than that of the first silicon layer.

\* \* \* \* \*

UNITED STATES PATENT AND TRADEMARK OFFICE
CERTIFICATE OF CORRECTION

PATENT NO. : 6,344,380 B1
DATED : February 5, 2002
INVENTOR(S) : Hyeon-cheol Kim et al.

It is certified that error appears in the above-identified patent and that said Letters Patent is hereby corrected as shown below:

Column 8,
Line 13, please change "aid" to -- and --.

Signed and Sealed this

Eleventh Day of June, 2002

Attest:

Attesting Officer

JAMES E. ROGAN
*Director of the United States Patent and Trademark Office*